United States Patent
Fang et al.

(10) Patent No.: US 12,040,380 B2
(45) Date of Patent: Jul. 16, 2024

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Chun-Pin Fang, Tainan (TW); Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 336 days.

(21) Appl. No.: 17/163,575

(22) Filed: Feb. 1, 2021

(65) Prior Publication Data
US 2022/0216325 A1 Jul. 7, 2022

(30) Foreign Application Priority Data

Jan. 4, 2021 (CN) .......................... 202110002380.2

(51) Int. Cl.
| | |
|---|---|
| *H01L 29/66* | (2006.01) |
| *H01L 29/205* | (2006.01) |
| *H01L 29/207* | (2006.01) |
| *H01L 29/778* | (2006.01) |

(Continued)

(52) U.S. Cl.
CPC ...... *H01L 29/66462* (2013.01); *H01L 29/205* (2013.01); *H01L 29/207* (2013.01); *H01L 29/7786* (2013.01); *H01L 21/0254* (2013.01); *H01L 21/0257* (2013.01); *H01L 29/2003* (2013.01)

(58) Field of Classification Search
CPC ......... H01L 29/66462; H01L 29/66431; H01L 29/205; H01L 29/207; H01L 29/7786; H01L 21/0254; H01L 21/0257; H01L 29/15; H01L 29/122; H01L 29/152; H01L 29/154; H01L 29/155; H01L 29/157; H01L 29/158; H01L 29/165; H01L 29/225; H01L 29/267; H01L 29/2003; H01L 29/2006; H01L 29/778; H01L 29/7781; H01L 29/7782; H01L 29/7783; H01L 29/7784; H01L 29/7785; H01L 29/7787; H01L 29/7788; H01L 2924/13064
See application file for complete search history.

(56) References Cited

U.S. PATENT DOCUMENTS

| | | | |
|---|---|---|---|
| 9,960,264 B1 * | 5/2018 | Chen | ................ H01L 29/66462 |
| 2008/0308813 A1 | 12/2008 | Suh et al. | |
| 2018/0308925 A1 * | 10/2018 | Chen | .................... H01L 29/063 |

(Continued)

OTHER PUBLICATIONS

Im, "1/f noise characteristics of AlGaN/GaN HEMTs with periodically carbon-doped GaN buffer layer", Microelectronic Engineering, vol. 215, Jul. 15, 2019, 110985.

*Primary Examiner* — Cuong B Nguyen
(74) *Attorney, Agent, or Firm* — Winston Hsu

(57) ABSTRACT

A method for fabricating a high electron mobility transistor (HEMT) includes the steps of: forming a buffer layer on a substrate; performing an in-situ doping process to form a first fluorine-containing layer on the buffer layer; forming a barrier layer on the first fluorine-containing layer; forming a second fluorine-containing layer on the barrier layer; forming a gate electrode on the second fluorine-containing layer; and forming a source electrode and a drain electrode adjacent to two sides of the gate electrode.

17 Claims, 1 Drawing Sheet

(51) Int. Cl.
  *H01L 21/02*  (2006.01)
  *H01L 29/20*  (2006.01)

(56) References Cited

U.S. PATENT DOCUMENTS

| | | | |
|---|---|---|---|
| 2020/0006543 A1* | 1/2020 | Tu | H01L 29/66462 |
| 2020/0212212 A1* | 7/2020 | Chen | H01L 29/0638 |
| 2021/0066481 A1* | 3/2021 | Li | H01L 29/778 |
| 2021/0083084 A1* | 3/2021 | Chang | H01L 29/66462 |
| 2022/0093780 A1* | 3/2022 | Huang | H01L 29/0657 |
| 2022/0376082 A1* | 11/2022 | Zhang | H01L 29/2003 |

* cited by examiner

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and fabrication method thereof.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of: forming a buffer layer on a substrate; performing an in-situ doping process to form a first fluorine-containing layer on the buffer layer; forming a barrier layer on the first fluorine-containing layer; forming a second fluorine-containing layer on the barrier layer; forming a gate electrode on the second fluorine-containing layer; and forming a source electrode and a drain electrode adjacent to two sides of the gate electrode.

According to another aspect of the present invention, a high electron mobility transistor (HEMT) includes: a buffer layer on a substrate; a first fluorine-containing layer on the buffer layer; a barrier layer on the first fluorine-containing layer; a gate electrode on the barrier layer; and a source electrode and a drain electrode adjacent to two sides of the gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
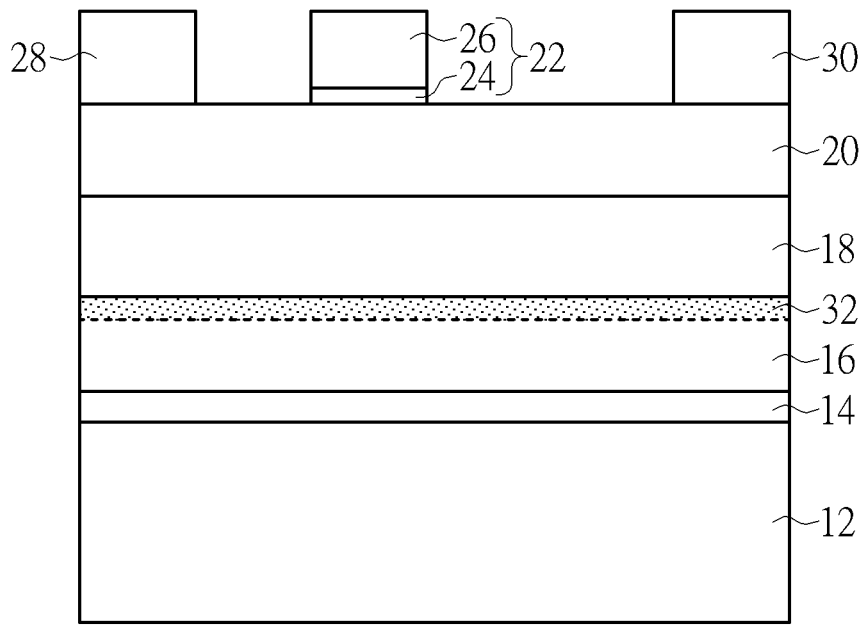
FIG. 1 illustrates a structural view of a HEMT according to an embodiment of the present invention.

Referring to FIG. 1, FIG. 1 illustrates a structural view of a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer 14 and a buffer layer 16 are formed on the substrate 12. According to an embodiment of the present invention, the nucleation layer 14 preferably includes aluminum nitride (AlN) and the buffer layer 16 is preferably made of III-V semiconductors such as gallium nitride (GaN), in which a thickness of the buffer layer 16 could be between 0.5 microns to 10 microns. According to an embodiment of the present invention, the formation of the buffer layer 16 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

It should be noted that an in-situ doping process is preferably conducted during the formation of the buffer layer 16 to form a fluorine-containing layer 32 on the surface of the buffer layer 16, in which the concentration of fluorine in the fluorine-containing layer 32 is approximately $1.0 \times 10^{15}$ ions/cm$^2$ and the thickness of the fluorine-containing layer 32 is equal to or less than ⅓ of the overall thickness of the entire buffer layer 16. According to an embodiment of the present invention, the buffer layer 16 could be made of a step graded buffer layer or a superlattice buffer layer. If the buffer layer 16 were to be a step graded buffer layer having gradient concentration, the buffer layer 16 is preferably made of a plurality of graded AlGaN layers, whereas if the buffer layer 16 were to be a superlattice buffer layer, the buffer layer 16 is preferably made of a plurality of carbon-doped GaN layers.

Next, an unintentionally doped (UID) buffer layer 18 is formed on the surface of the fluorine-containing layer 32. In this embodiment, the UID buffer layer 18 is preferably made of III-V semiconductors such as gallium nitride (GaN) or more specifically unintentionally doped GaN. According to an embodiment of the present invention, the formation of the UID buffer layer 18 on the buffer layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 20 is formed on the surface of the UID buffer layer 18. In this embodiment, the barrier layer 20 is preferably made of III-V semiconductor such as n-type or n-graded aluminum gallium nitride ($Al_xGa_{1-x}N$), in which 0<x<1, the barrier layer 20 preferably includes an epitaxial layer formed through epitaxial growth process, and the barrier layer 20 could include dopants such as silicon or germanium. Similar to the buffer layer 16 and the UID buffer layer 18, the formation of the barrier layer 20 on the UID buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a gate dielectric layer and a gate material layer are formed on the surface of the barrier layer 20, and a photo-etching process is conducted to remove part of the gate material layer and part of the gate dielectric layer to form a gate structure 22 on the surface of the barrier layer 20, in which the gate structure 22 preferably includes a patterned gate dielectric layer 24 and a gate electrode 26. In this embodiment, the bottom portion of the gate electrode 26 could include semiconductor material such as p-type GaN while the top portion of the gate electrode 26 could include metal such as Schottky metal including but not limited to for example gold (Au), silver (Ag), or platinum (Pt). The gate dielectric layer 24 could include silicon oxide, aluminum nitride (AlN), or aluminum oxide (AlO).

Next, a source electrode 28 and a drain electrode 30 are formed adjacent to two sides of the gate electrode 26. In this embodiment, the source electrode 28 and the drain electrode 30 are preferably made of metal. Nevertheless, in contrast to the top portion of the gate electrode 26 made of Schottky metal, the source electrode 28 and the drain electrode 30 are preferably made of ohmic contact metals. According to an embodiment of the present invention, each of the source electrode 28 and drain electrode 30 could include titanium (Ti), aluminum (Al), tungsten (W), palladium (Pd), or combination thereof. Moreover, it would be desirable to first conduct a photo-etching process to remove part of the barrier layer 20 adjacent to two sides of the gate electrode 26 for forming recesses, conduct an electroplating process, sputtering process, resistance heating evaporation process, electron beam evaporation process, physical vapor deposition (PVD) process, chemical vapor deposition (CVD) process, or combination thereof to form electrode materials in the recesses, and then pattern the electrode materials through etching process to form the source electrode 28 and the drain electrode 30.

Figure 2:
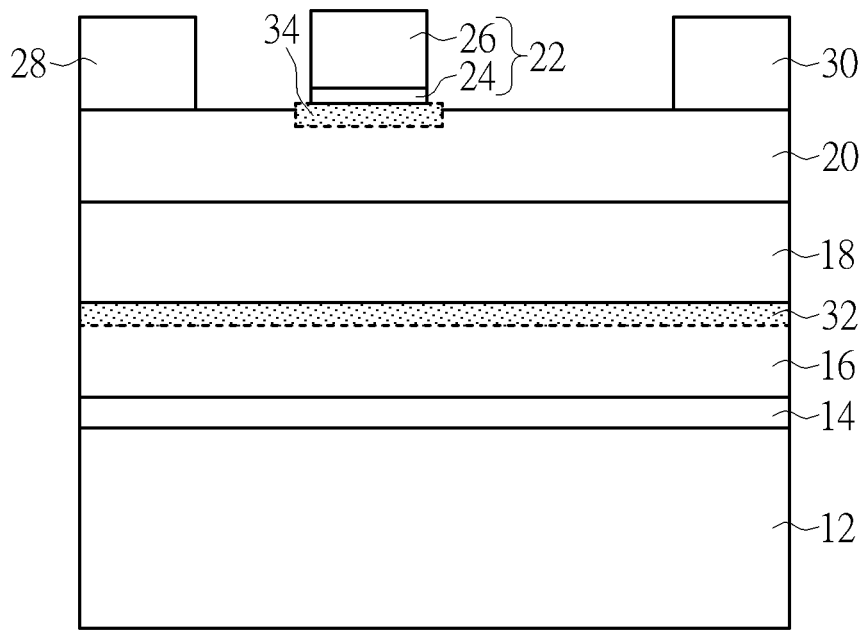
FIG. 2 illustrates a structural view of a HEMT according to an embodiment of the present invention.

Referring to FIG. 2, FIG. 2 illustrates a structural view of a HEMT according to an embodiment of the present invention. As shown in FIG. 2, in contrast to the aforementioned embodiment of forming the gate structure 22 immediately after forming the barrier layer 20, it would also be desirable to conduct another in-situ doping process during the formation of the barrier layer 20 for forming another fluorine-containing layer 34 on the surface of the barrier layer 20, in which the concentration of fluorine within the fluorine-containing layer 34 could be equal to or different from the fluorine concentration within the fluorine-containing layer 32. For instance, the concentration of fluorine in the fluorine-containing layer 34 could be approximately $1.0 \times 10^{15}$ ions/cm$^2$ and the thickness of the fluorine-containing layer 34 is equal to or less than 1/3 of the overall thickness of the entire barrier layer 20.

Next, a photo-etching process could be conducted to remove part of the fluorine-containing layer 34 and then conduct the formation of the gate structure 22 thereafter. Alternatively, it would be desirable to first form the aforementioned gate dielectric layer and gate material layer on the surface of the fluorine-containing layer 34, and then conduct a photo-etching process to remove part of the gate material layer, part of the gate dielectric layer, and part of the fluorine-containing layer 34 to form gate structure 22 on surface of the patterned fluorine-containing layer 34, which is also within the scope of the present invention. Structurally, the top surface of the fluorine-containing layer 34 could be even with or slightly higher than the top surface of the barrier layer 20 on adjacent two sides, the width of the fluorine-containing layer 34 could be equal to or greater than the width of the gate structure 22, and two sidewalls of the fluorine-containing layer 34 could be aligned with or not aligned with two sidewalls of the gate structure 22. Since the fluorine-containing layer 34 is patterned by a photo-etching process, the width of the fluorine-containing layer 34 is preferably less than the width of the fluorine-containing layer 32 disposed on surface of the buffer layer 16.

Typically, a heterojunction is formed at the interface between the buffer layer and barrier layer as a result of the bandgap difference between the two layers. Essentially a quantum well is formed in the banding portion of the conduction band of the heterojunction to constrain the electrons generated by piezoelectricity so that a channel region or two-dimensional electron gas (2DEG) is formed at the junction between the buffer layer and barrier layer to form conductive current.

Conventional approach of switching a Normally-on operation to a Normally-off operation in HEMT could be accomplished by first forming a hard mask on the barrier layer, pattern the hard mask to form an opening exposing the surface of the barrier layer, and then inject fluorine ions directly into the barrier layer through ion implantation, in which the injected fluorine ions preferably attract free electrons and then become negative fixed charged for adjusting local potentials thereby depleting 2DEG Nevertheless, the approach of using conventional ion implantation for injecting fluorine ions is unable to control the depth of the fluorine region accurately thereby affecting resistance of the device. To resolve this issue, the present invention preferably conducts an in-situ doping process to inject fluorine ions onto the surface of the aforementioned buffer layer 16 and/or barrier layer 20 for improving overall uniformity of the fluorine-containing layer being formed and reducing flicker noise of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:
    forming a buffer layer on a substrate;
    forming a first fluorine-containing layer on the buffer layer, wherein the first fluorine-containing layer contacts the buffer layer directly, and wherein a sidewall of the first fluorine-containing layer is aligned with a sidewall of the buffer layer;
    forming a barrier layer on the first fluorine-containing layer;
    forming a second fluorine-containing layer on the barrier layer;
    patterning the second fluorine-containing layer;
    forming a gate electrode on the second fluorine-containing layer; and
    forming a source electrode and a drain electrode adjacent to two sides of the gate electrode.

2. The method of claim 1, further comprising performing an in-situ doping process to form the first fluorine-containing layer.

3. The method of claim 1, further comprising:
    forming an unintentionally doped (UID) buffer layer on the buffer layer; and
    forming the barrier layer on the UID buffer layer.

4. The method of claim 1, wherein the buffer layer comprises a group III-V semiconductor.

5. The method of claim 1, wherein the buffer layer comprises a step graded buffer layer.

6. The method of claim 5, wherein the buffer layer comprises graded AlGaN layers.

7. The method of claim 1, wherein the buffer layer comprises a superlattice buffer layer.

8. The method of claim 7, wherein the buffer layer comprises carbon-doped gallium nitride (GaN) layers.

9. The method of claim 1, wherein the barrier layer comprise $Al_xGa_{1-x}N$.

10. A high electron mobility transistor (HEMT), comprising:
- a buffer layer on a substrate;
- a first fluorine-containing layer on the buffer layer, wherein the first fluorine-containing layer contacts the buffer layer directly, and wherein a sidewall of the first fluorine-containing layer is aligned with a sidewall of the buffer layer;
- a barrier layer on the first fluorine-containing layer;
- an unintentionally doped (UID) buffer layer on the buffer layer, and the barrier layer on the UID buffer layer;
- a second fluorine-containing layer on the barrier layer;
- a gate electrode on the second fluorine-containing layer, wherein a width of the second fluorine-containing layer is greater than a width of the gate electrode; and
- a source electrode and a drain electrode adjacent to two sides of the gate electrode.

11. The HEMT of claim 10, wherein the buffer layer comprises a group III-V semiconductor.

12. The HEMT of claim 10, wherein the buffer layer comprises a step graded buffer layer.

13. The HEMT of claim 12, wherein the buffer layer comprises graded AlGaN layers.

14. The HEMT of claim 10, wherein the buffer layer comprises a superlattice buffer layer.

15. The HEMT of claim 14, wherein the buffer layer comprises carbon-doped gallium nitride (GaN) layers.

16. The HEMT of claim 10, wherein a width of the first flourine-containing layer is greater than the width of the second fluorine-containing layer.

17. The HEMT of claim 10, wherein the barrier layer comprise $Al_xGa_{1-x}N$.

* * * * *